(12) United States Patent
Yoshimura et al.

(10) Patent No.: US 7,615,413 B2
(45) Date of Patent: Nov. 10, 2009

(54) METHOD OF MANUFACTURING STACK-TYPE SEMICONDUCTOR DEVICE AND METHOD OF MANUFACTURING STACK-TYPE ELECTRONIC COMPONENT

(75) Inventors: Atsushi Yoshimura, Yokosuka (JP); Tadanobu Ookubo, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 272 days.

(21) Appl. No.: 11/390,285

(22) Filed: Mar. 28, 2006

(65) Prior Publication Data
US 2006/0226520 A1  Oct. 12, 2006

(30) Foreign Application Priority Data

| Mar. 28, 2005 | (JP) | ............................ P2005-092595 |
| Mar. 28, 2005 | (JP) | ............................ P2005-092596 |

(51) Int. Cl.
*H01L 21/00* (2006.01)

(52) U.S. Cl. ................. 438/113; 257/778; 257/E21.505

(58) Field of Classification Search ................. 438/108, 438/109, 114, 118, 455, 458; 257/777, 778
See application file for complete search history.

(56) References Cited

U.S. PATENT DOCUMENTS

| 5,220,200 | A  | 6/1993  | Blanton |
| 5,804,004 | A  | 9/1998  | Tuckerman et al. |
| 6,100,594 | A  | 8/2000  | Fukui et al. |
| 6,333,562 | B1 | 12/2001 | Lin |
| 6,352,879 | B1 | 3/2002  | Fukui et al. |
| 6,545,365 | B2 | 4/2003  | Kondo et al. |
| 6,657,290 | B2 | 12/2003 | Fukui et al. |
| 2005/0074921 | A1 | 4/2005 | Yamagata |

(Continued)

FOREIGN PATENT DOCUMENTS

JP         8-288455         11/1996

(Continued)

OTHER PUBLICATIONS

Yoshimura, A. et al., "Stacked Electronic Component and Manufacturing Method Thereof", U.S. Appl. No. 11/132,290, filed May 19, 2005.

(Continued)

*Primary Examiner*—W. David Coleman
*Assistant Examiner*—Sonya D McCall-Shepard
(74) *Attorney, Agent, or Firm*—Finnegan, Henderson, Farabow, Garrett & Dunner, L.L.P.

(57) ABSTRACT

A first semiconductor element is bonded on a substrate. A complex film formed of integrated dicing film and adhesive film is affixed on a rear surface of a semiconductor wafer which is to be second semiconductor elements, the dicing film having a thickness within a range of not less than 50 μm nor more than 140 μm and a room temperature elastic modulus within a range of not less than 30 MPa nor more than 120 MPa, and the adhesive film having a thickness of 30 μm or more and a room temperature elastic modulus before curing within a range of not less than 500 MPa nor more than 1200 MPa. The semiconductor wafer together with the adhesive film is divided into the second semiconductor elements. The second semiconductor element is picked up from the dicing film to be bonded on the first semiconductor element.

6 Claims, 14 Drawing Sheets

U.S. PATENT DOCUMENTS

| | | | |
|---|---|---|---|
| 2005/0205981 A1 | 9/2005 | Yoshimura et al. | |
| 2006/0226525 A1* | 10/2006 | Osuga et al. | 257/685 |
| 2007/0026572 A1* | 2/2007 | Hatakeyama et al. | 438/113 |

FOREIGN PATENT DOCUMENTS

| | | |
|---|---|---|
| JP | 2001-217384 | 8/2001 |
| JP | 2001-308262 | 11/2001 |
| JP | 2002-222913 | 8/2002 |
| JP | 2003-179200 | 6/2003 |
| JP | 2003-218316 | 7/2003 |
| JP | 2004-072009 | 3/2004 |
| JP | 2004-193363 | 7/2004 |

OTHER PUBLICATIONS

Notification of the First Office Action issued by the Chinese Patent Office on Feb. 1, 2008, for Chinese Patent Application No. 200610058497.8, and English-language translation thereof.

* cited by examiner

METHOD OF MANUFACTURING STACK-TYPE SEMICONDUCTOR DEVICE AND METHOD OF MANUFACTURING STACK-TYPE ELECTRONIC COMPONENT

CROSS-REFERENCE TO RELATED APPLICATIONS

This application is based upon and claims the benefit of priority from the prior Japanese Patent Application No. 2005-092595 and Japanese Patent Application No. 2005-092596 filed on Mar. 28, 2005; the entire contents which are incorporated herein by reference.

BACKGROUND

1. Field of the Invention

The present invention relates to a method of manufacturing a stack-type semiconductor device in which a plurality of semiconductor elements are stacked, and to a method of manufacturing a stack-type electronic component in which a plurality of electronic components are stacked.

2. Description of the Related Art

In order to realize downsizing, higher-density packaging, and the like of a semiconductor device, a stack-type multichip package in which a plurality of semiconductor elements are stacked and sealed in one package has been in practical use in recent years. In the stack-type multichip package, the plural semiconductor elements are stacked in sequence on a circuit board via an adhesive film. Electrode pads of the semiconductor elements are electrically connected to electrode parts of the circuit board via bonding wires. Such a stacked structure is packaged by sealing resin, whereby the stack-type multichip package is formed.

In the stack-type multichip package, the upper semiconductor element, if smaller than the lower semiconductor element, does not interfere with the bonding wires of the lower semiconductor element. However, such a structure greatly limits applicable semiconductor elements. Therefore, an effort is being made to widen the applicable range to semiconductor elements in the same shape and to semiconductor elements with an upper one being larger than a lower one. Stacking semiconductor elements in the same shape or stacking a larger semiconductor element on an upper side of a lower semiconductor involves a possibility that bonding wires of the lower semiconductor element come in contact with the upper semiconductor element. Therefore, it is important to prevent the occurrence of insulation failure, short circuit, and the like ascribable to the contact of the bonding wires.

So, there is an art to make an adhesive layer for bonding semiconductor elements thick enough to prevent bonding wires of a lower semiconductor element from coming in contact with an upper semiconductor element (see, for example, Japanese Patent Laid-open Application No. 2001-308262, Japanese Patent Laid-open Application No. 2004-072009). Specifically, an adhesive layer having a thickness large enough to prevent the contact of the bonding wires is formed on a rear surface side of the upper semiconductor element. To form the adhesive layer, for example, an adhesive film and a dicing film are affixed in sequence on a rear surface of a semiconductor wafer and the semiconductor wafer is divided. After the semiconductor elements are stacked via the adhesive layer and the bonding wires are taken into the adhesive layer whose viscosity has become low by heating, the adhesive layer is cured, whereby the semiconductor elements are bonded together.

Another proposed art is to form an insulating layer on a rear surface side of an upper semiconductor element, thereby preventing insulation failure, short circuit, and the like ascribable to the contact of bonding wires of a lower semiconductor element with the upper semiconductor element (see, for example, U.S. Pat. No. 6,657,290). For example, an insulator film (insulating layer) and an adhesive film (adhesive layer) are affixed on a rear surface of a semiconductor wafer in sequence. The semiconductor wafer is divided together with the films, whereby semiconductor elements are made. Such a semiconductor element is bonded on the lower semiconductor element. Insulation failure and short circuit ascribable to the contact of the bonding wires are prevented by the insulating layer which is stacked together with the adhesive layer on the rear surface of the upper semiconductor element.

As described above, for preventing connection failure of the bonding wires based on the thickness of the adhesive layer interposed between the semiconductor elements, the adhesive layer needs to be sufficiently thick. In addition, since the bonding wires connected to the lower semiconductor element are partly taken into the adhesive layer, the adhesive layer needs to have viscosity not causing the deformation or connection failure of the bonding wires. It has been found out that the use of a low-viscosity, thick adhesive layer (adhesive film) causes various problems if conventional manufacturing processes, materials, and the like are simply applied.

A complex film formed by stacking a low-viscosity, thick adhesive film on a conventional dicing film is low in removability from a release tape, and failure in bonding it to a semiconductor wafer is liable to occur. Further, simply increasing removability of the complex film from the release tape may possibly cause inconvenience in picking up the semiconductor element from the dicing film. That is, pickup failure of the semiconductor element is liable to occur.

Further, if viscosity of the adhesive layer at the bonding time is made too low in order to prevent the deformation and connection failure of the bonding wires that might occur when the elements are bonded, an adhesive sticks out from an end face of the element or a layered form cannot be maintained. Consequently, the lower bonding wires easily come into contact with the upper semiconductor element. On the other hand, if the viscosity of the adhesive layer is too high at the bonding time, the bonding wires are liable to suffer deformation and connection failure, and in addition, portions left unfilled with adhesive resin is liable to occur under the bonding wires.

In a subsequent resin molding process, it is also difficult to fill the resin in the resin unfilled portions under the wires, and therefore, bubbles due to the resin unfilled portions remain. The occurrence of bubbles in the semiconductor device tends to cause peeling starting from the bubbles and leakage in a reliability test on hygroscopic properties, solder reflow, and the like. This will be a cause of lowering reliability of the semiconductor device. These problems are likely to occur not only in a semiconductor device in which a plurality of semiconductor elements are stacked but also in a stack-type electronic component in which various electronic components are stacked and packaged.

SUMMARY

It is an object of the present invention to provide a method of manufacturing a stack-type semiconductor device that can reduce failure occurrence ascribable to a process of affixing an adhesive film on a rear surface of an upper semiconductor element and a process of bonding the upper semiconductor element, when a stack-type semiconductor device is manufactured by stacking a plurality of semiconductor elements. It is another object of the present invention to provide a method of manufacturing a stack-type electronic component that can reduce failure occurrence ascribable to sticking out of an adhesive from an end face of a component, deterioration in layered from, and so on, when part of lower bonding wires are taken into an adhesive layer.

A method of manufacturing a stack-type semiconductor device according to one embodiment of the present invention includes: bonding a first semiconductor element on a substrate; affixing a complex film formed of a dicing film and an adhesive film that are integrated, on a rear surface of a semiconductor wafer having a plurality of element regions which are to be second semiconductor elements, the dicing film having a thickness within a range of not less than 50 μm nor more than 140 μm and a room temperature elastic modulus within a range of not less than 30 MPa nor more than 120 MPa, and the adhesive film having a thickness of 30 μm or more and a room temperature elastic modulus before curing within a range of not less than 500 MPa nor more than 1200 MPa; forming the second semiconductor elements by dividing the semiconductor wafer on which the complex film is affixed, together with the adhesive film, into the element regions; picking up the second semiconductor element from the dicing film; and bonding the picked-up second semiconductor element on the first semiconductor element by using, as an adhesive layer, the adhesive film affixed on a rear surface of the second semiconductor element.

A method of manufacturing a stack-type semiconductor device according to another embodiment of the present invention includes: bonding a first semiconductor element on a substrate; connecting an electrode part of the substrate and an electrode pad of the first semiconductor element via a first bonding wire; placing the first semiconductor element bonded on the substrate, on a stage having a heating mechanism to heat the first semiconductor element; positioning a second semiconductor element held by a suction tool above the heated first semiconductor element, with a thermosetting adhesive layer interposed between the first semiconductor element and the second semiconductor element; gradually moving down the second semiconductor element, softening or melting the adhesive layer by radiant heat from the heated first semiconductor element and by heat transferred from the first boning wire, and bringing the adhesive layer into contact with the first semiconductor element while taking the first bonding wire into the adhesive layer; and applying a pressure to the second semiconductor element while continuing the heating by the heating mechanism, and thermally curing the adhesive layer to bond the first semiconductor element and the second semiconductor element.

A method of manufacturing a stack-type electronic component according to still another embodiment of the present invention includes: bonding a first electronic component on a substrate; connecting an electrode part of the substrate and an electrode pad of the first electronic component via a first bonding wire; placing the first electronic component bonded on the substrate, on a stage having a heating mechanism to heat the first electronic component; positioning a second electronic component held by a suction tool above the heated first electronic component, with a thermosetting adhesive layer interposed between the first electronic component and the second electronic component; gradually moving down the second electronic component, softening or melting the adhesive layer by radiant heat from the heated first electronic component and by heat transferred from the first bonding wire, and bringing the adhesive layer into contact with the first electronic component while taking the first bonding wire into the adhesive layer; and applying a pressure to the second electronic component while continuing the heating by the heating mechanism, and thermally curing the adhesive layer to bond the first electronic component and the second electronic component.

DETAILED DESCRIPTION

Hereinafter, embodiments of the present invention will be described with reference to the drawings. The drawings, though referred to in describing the embodiments of the present invention, are provided only for an illustrative purpose and in no way limit the present invention.

Figure 1:
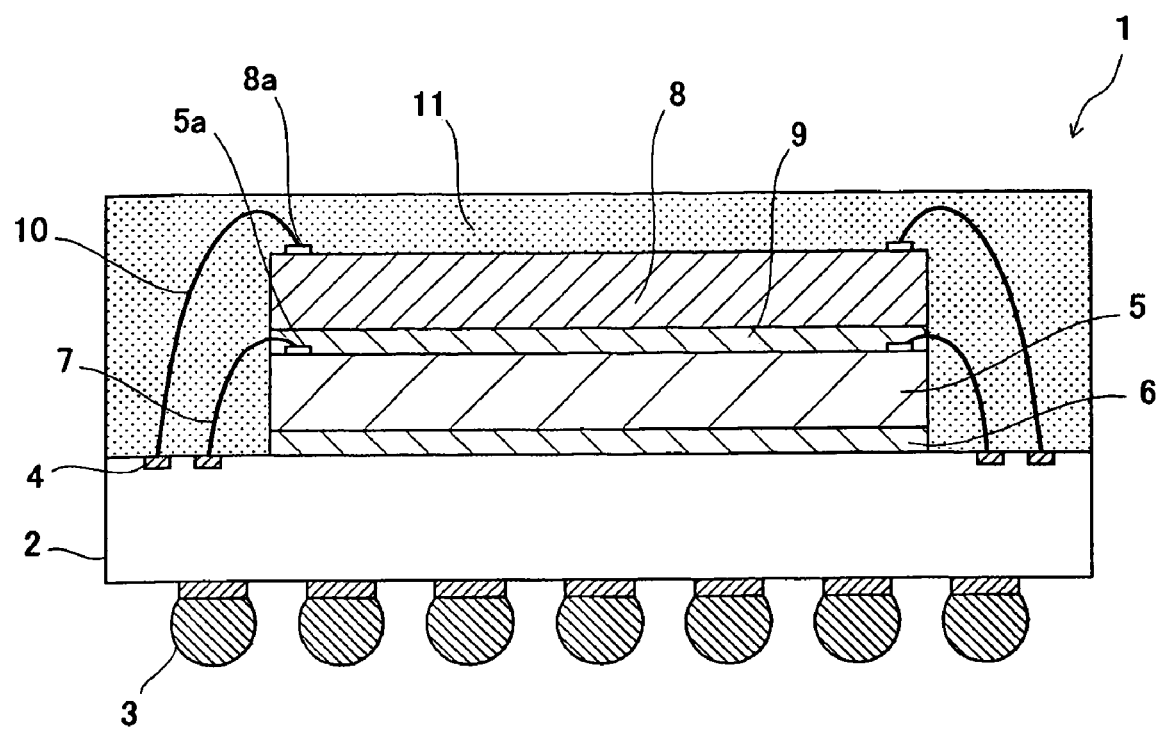
FIG. 1 is a cross-sectional view showing a structure of a stack-type semiconductor device manufactured by applying a manufacturing method according to an embodiment of the present invention.

FIG. 1 is a cross-sectional view showing a structure of a semiconductor device with a stack-type multichip structure, that is formed by applying a method of manufacturing a stack-type semiconductor device according to an embodiment of the present invention. A stack-type semiconductor device 1 shown in FIG. 1 has an element mounting substrate 2. Any substrate may be used as the element mounting substrate 2, providing that it can have a semiconductor element mounted thereon and has a circuit. Examples usable as such a substrate 2 are a circuit board, such as an insulating substrate and a semiconductor substrate, having a circuit on a surface thereof or in an inner part thereof, and a substrate such as a lead frame in which an element mounting part and a circuit part are integrated.

The stack-type semiconductor device 1 shown in FIG. 1 has the circuit board as the element mounting substrate 2. Examples usable as a substrate constituting the circuit board 2 are an insulating substrate such as a resin substrate, a ceramic substrate, and a glass substrate, or substrates made of various kinds of materials, such as a semiconductor substrate. An example of a circuit board using a resin substrate is a typical multilayer copper-clad laminate (multilayer printed wiring board) or the like. On a bottom surface of the circuit board 2, external connection terminals 3 such as solder bumps are provided.

On an upper surface, which is to be an element mounting surface, of the circuit board 2, electrode parts 4 electrically connected to the external connection terminals 3 via, for example, inner layer wirings (not shown) are provided. The electrode parts 4 will be wire bonding parts. On the element mounting surface (upper surface) of such a circuit board 2, a first semiconductor element 5 as a first electronic component is bonded via a first adhesive layer 6. A typical die attach material (die attach film or the like) is used as the first adhesive layer 6. First electrode pads 5a provided on an upper surface of the first semiconductor element 5 are electrically connected to the electrode parts 4 of the circuit board 2 via first bonding wires 7.

A second semiconductor element 8 as a second electronic component is bonded on the first semiconductor element 5 via a second adhesive layer 9. The second semiconductor element 8 has a shape same as or at least partly larger than the first semiconductor element 5. The second adhesive layer 9 softens or melts by bonding temperature of the second semiconductor element 8, and bonds the first semiconductor element 5 and the second semiconductor element 8 while taking part of the first bonding wires 7 (end portions connected to the electrode pads 5a) therein. The end portions of the first bonding wires 7 on the electrode pad 5a side are taken into the second adhesive layer 9 so that the contact thereof with the second semiconductor element 8 is prevented.

In order to obtain a function of preventing the contact between the first bonding wires 7 and the second semiconductor element 8, an insulating resin layer having a thickness of 30 μm or more is preferably used as the second adhesive layer 9. If the thickness of the second adhesive layer 9 is less than 30 μm, the first bonding wires 7 easily come into contact with the second semiconductor element 8, resulting in an increased incidence of insulation failure, short circuit, and the like. The thickness of the second adhesive layer 9 is preferably 60 μm or more, though depending on wire diameter. A concrete example of the thickness of the second adhesive layer 9 when the diameter of the bonding wires 7 is 25 μm is 75 μm or 85 μm. Too large a thickness of the second adhesive layer 9 hinders thinning of the stack-type semiconductor device 1, and therefore, the thickness of the second adhesive layer 9 is preferably 150 μm or less.

In order for the second adhesive layer 9 to take part of the first bonding wires 7 therein in good condition at the bonding time, the viscosity of the second adhesive layer 9 at the heating temperature at the bonding time (bonding-time viscosity) is preferably not less than 1 kPa·s and less than 100 kPa·s. The second adhesive layer 9 whose bonding-time viscosity is less than 1 kPa·s is too soft and thus the adhesive is likely to stick out from an element end face. On the other hand, the second adhesive layer 9 whose bonding-time viscosity is 100 kPa·s or more is likely to cause deformation, connection failure, or the like of the first bonding wires 7. The bonding-time viscosity of the second adhesive layer 9 is preferably within a range from 1 kPa·s to 50 kPa·s, more preferably, within a range from 1 kPa·s to 20 kPa·s.

Figure 2:
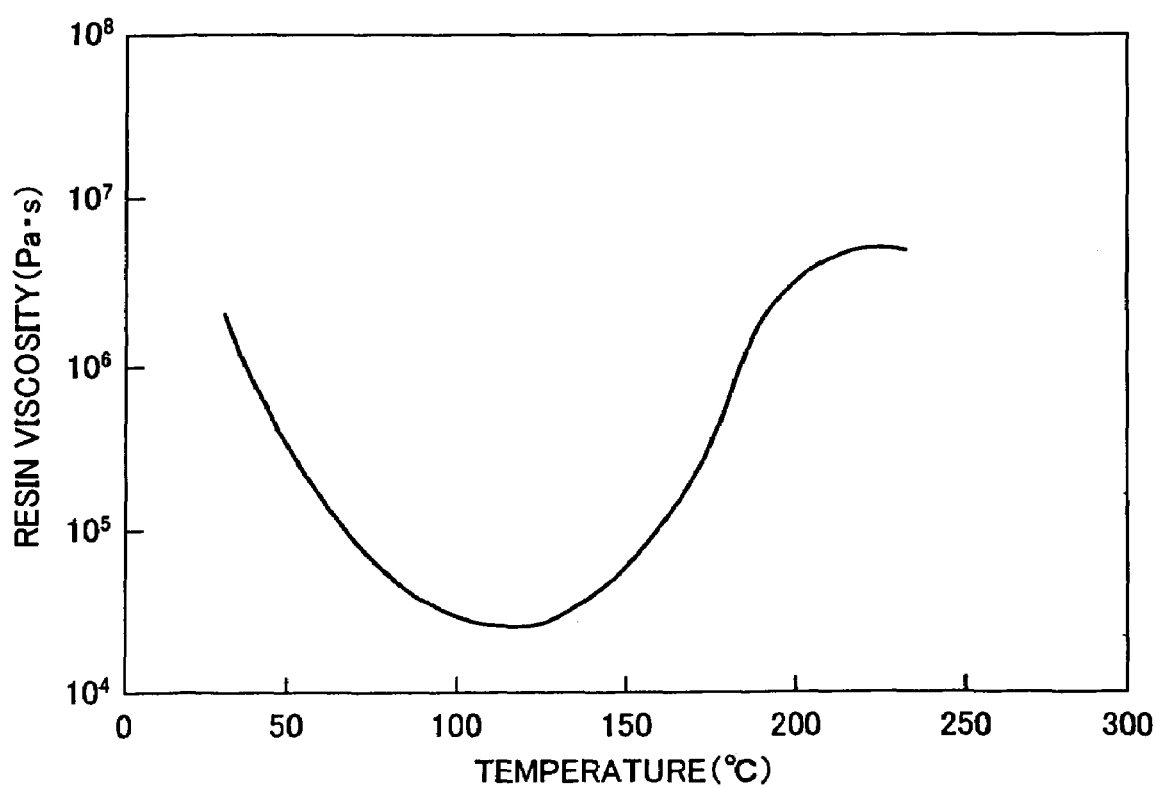
FIG. 2 is a graph showing a viscosity characteristic of adhesive resin used in the embodiment of the present invention.

An example used as the insulating resin forming the second adhesive layer 9 is thermosetting resin such as epoxy resin. The bonding-time viscosity of the thermosetting resin may be adjusted by the composition or the like of a thermosetting resin composition, or can be adjusted by the heating temperature in a bonding process. FIG. 2 shows an example of a viscosity characteristic of a pre-cured die attach material made of epoxy resin. The die attach material having the viscosity characteristic shown in FIG. 2 can have a bonding-time viscosity of less than 100 kPa·s when the bonding temperature is set within a range from about 70° C. to about 160° C. The boning-time viscosity can be further reduced to 50 kPa·s or less when the bonding temperature is set within a range from about 80° C. to about 140° C.

Second electrode pads 8a provided on an upper surface of the second semiconductor element 8 bonded on the first semiconductor element 5 are electrically connected to the electrode parts 4 of the circuit board 2 via second bonding wires 10. The first and second semiconductor elements 5, 8 disposed in the stacked manner on the circuit board 2 are sealed by sealing resin 11 such as, for example, epoxy resin, so that the stack-type semiconductor device 1 having the stack-type multichip package structure is formed. Although the structure in which the two semiconductor elements 5, 8 are stacked is described in FIG. 1, the number of stacked semiconductor elements is not limited to two but may be three or more.

Next, manufacturing processes of a stack-type semiconductor device according to a first embodiment of the present invention will be described. Here, based on the above-described stack-type semiconductor device 1, the manufacturing processes according to the first embodiment will be described. First, using the first adhesive layer 6, the first semiconductor element 5 is bonded on the circuit board 2. Subsequently, a wire bonding process is carried out to electrically connect the electrode parts 4 of the circuit board 2 and the electrode pads 5a of the first semiconductor element 5 by the first bonding wires 7. Next, the second semiconductor element 8 is bonded on the first semiconductor element 5 via the second adhesive layer 9.

Figure 3A:
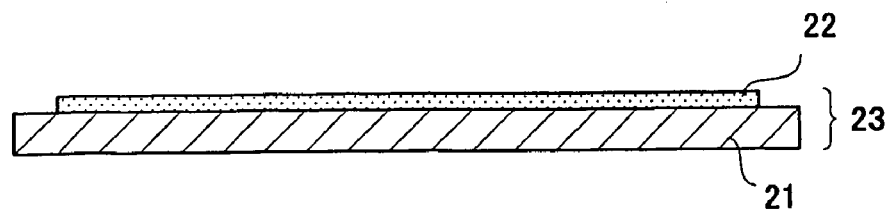
FIG. 3A, FIG. 3B, FIG. 3C, and FIG. 3D are cross-sectional views showing manufacturing processes of a stack-type semiconductor device according to a first embodiment of the present invention.

Before the bonding process of the second semiconductor element 8 is carried out, the second adhesive layer 9 is affixed as a semi-cured adhesive film on the second semiconductor element 8. In this event, the adhesive film is affixed together with a dicing film (tape) on a rear surface of a semiconductor wafer which is not yet divided into the second semiconductor elements 8. That is, as shown in FIG. 3A, a dicing film 21 and an adhesive film 22 with a thickness of 30 μm or more which is to be the second adhesive layer 9 are stacked and integrated to form a complex film 23. The dicing film 21 and the adhesive film 22 are integrated via, for example, a not-shown tacky layer. An example used as the tacky layer is a UV curable resin layer having a thickness of about 1 μm to about 30 μm.

As the dicing film 21, a resin film having a thickness of not less than 50 μm nor more than 140 μm and a room temperature elastic modulus (25° C.) of not less than 30 MPa nor more than 120 MPa, for example, a thermoplastic resin film such as a polyolefin resin film is used. The elastic modulus of the dicing film 21 made of thermoplastic resin is adjusted by the composition of a resin composition forming the film, an additive, or the like. The dicing film 21 may be a complex of two layers or more of resin layers different in elastic modulus. As for the elastic modulus in such a case, a preferable range of the complex elastic modulus of all the layers is not less than 30 MPa nor more than 120 MPa.

As the adhesive film 22, used is a thermosetting resin film having a thickness of 30 μm or more, more particularly, within a range from 60 μm to 150 μm (still more particularly, within a range from 60 μm to 100 μm) and a room temperature elastic modulus (25° C.) before curing of not less than 500 MPa nor more than 1200 MPa. The thermosetting resin film (22) in a semi-cured state (B-stage state) is stacked on and integrated with the dicing film 21. Here, the room temperature elastic modulus (25° C.) of the pre-cured adhesive film 22 is room temperature elastic modulus of the B-staged thermosetting resin film.

Figure 3B:
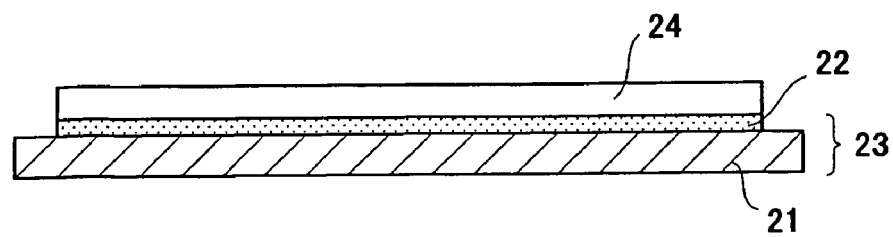
Figure 4:
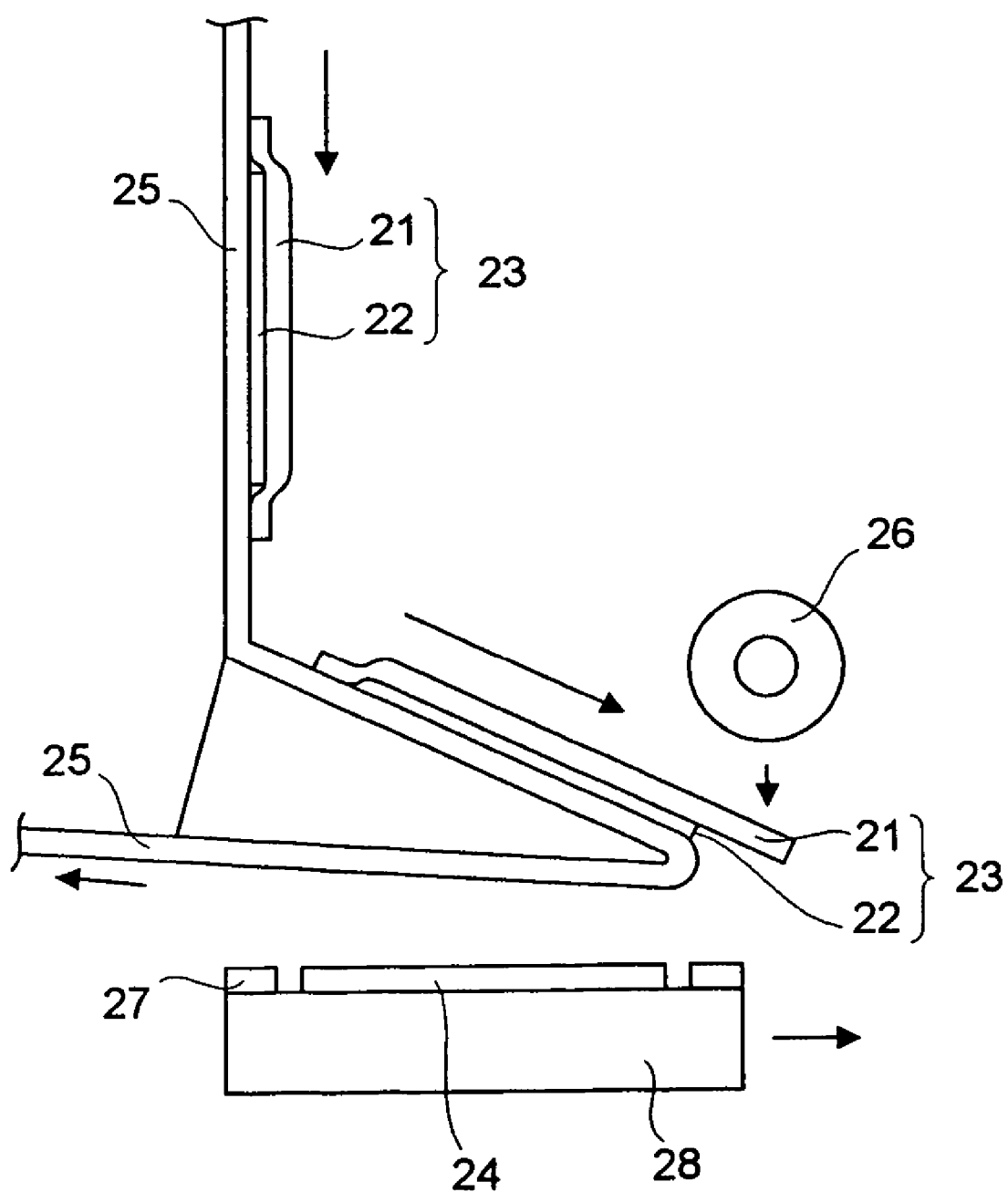
FIG. 4 is a view showing a process of affixing a complex film in the manufacturing processes of the stack-type semiconductor device shown in FIG. 3.

Next, as shown in FIG. 3B, the complex film 23 formed of the integrated dicing film 21 and adhesive film 22 is affixed on the rear surface of the semiconductor wafer 24 having a plurality of element regions which are to be the second semiconductor elements 8. In a process of bonding the complex film 23 on the semiconductor wafer 24, the complex film 23 is fed in a state of being affixed on a tape-formed separator (release paper) 25 as shown in FIG. 4, in view of improvement in efficiency of affixing the complex film 23, reduction in affixing cost, and so on. By folding the separator 25 with the complex film 23 affixed thereon at an acute angle, a leading edge of the complex film 23 is released from the separator 25.

The leading edge of the complex film 23 released from the separator 25 is pressed against the semiconductor wafer 24 by a roller 26 from an upper side, so that the complex film 23 is affixed on the rear surface of the semiconductor wafer 24. Though not shown in FIG. 3, a dicing process of the semiconductor wafer 24 is carried out while the dicing film 21 is strained on a flat ring (wafer ring) 27. Therefore, for affixing the released complex film 23, the separated leading edge thereof is sequentially pressed from the flat ring 27 which is disposed on a stage 28 together with the semiconductor wafer 24.

In the process of affixing the complex film 23 on the semiconductor wafer 24, if the adhesive film 22 is as thick as 30 μm or more, the use of a conventional dicing film involves a possibility that the leading edge of the complex film 23 cannot be released from the separator 25 even if the separator 25 is folded at an acute angle. Specifically, if the dicing film 21 is too thin or too soft (too low in room temperature elastic modulus) relative to the thickness of the adhesive film 22, the dicing film 21 follows the separator 25. Consequently, it might not be possible to release the leading edge of the dicing film 21 from the separator 25. In other words, an incidence of release failure of the dicing film 21 from the separator 25 increases.

Therefore, the dicing film 21 used in this embodiment has a thickness of 50 μm or more and a room temperature elastic modulus of 30 MPa or more. The use of such a dicing film 21 ensures that its leading edge is released from the separator 25. That is, it is possible to lower a failure incidence in the process of affixing the complex film 23 on the semiconductor wafer 24 (a failure incidence of the affixation itself of the complex film 23, poor affixation positioning, or the like). In view of increasing a success rate of affixing the complex film 23, the dicing film 21 preferably has a thickness of 85 μm or more, and more preferably, it has a room temperature elastic modulus (25° C.) of 40 MPa or more.

Figure 3C:
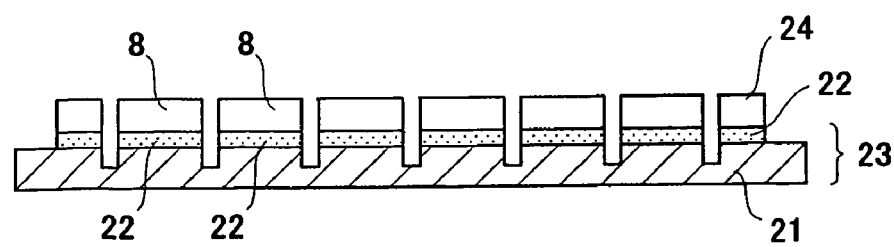

Next, the semiconductor wafer 24 having the complex film 23 affixed thereon is diced as shown in FIG. 3C into the respective element regions, whereby the second semiconductor elements 8 are made. At this time, the adhesive film 22 is cut together with the semiconductor wafer 24, and therefore, the second semiconductor element 8 has the adhesive film 22 in a cut piece state affixed on the rear surface thereof. Further, only part of a surface side of the dicing film 21 is cut, and therefore, the second semiconductor elements 8 separated by the division (in a cut piece state) are kept held by the dicing film 21.

In view of lowering a failure incidence in the dicing process of the semiconductor wafer 24, the pre-cured adhesive film 22 preferably has a room temperature elastic modulus (25° C.) of 500 MPa or more. If the room temperature elastic modulus (25° C.) of the adhesive film 22 is less than 500 MPa, burrs occurring at the time of dicing the semiconductor wafer 24 become longer, which lowers removability of the semiconductor element 8 from the dicing film 21 in a subsequent pickup process.

Figure 5:
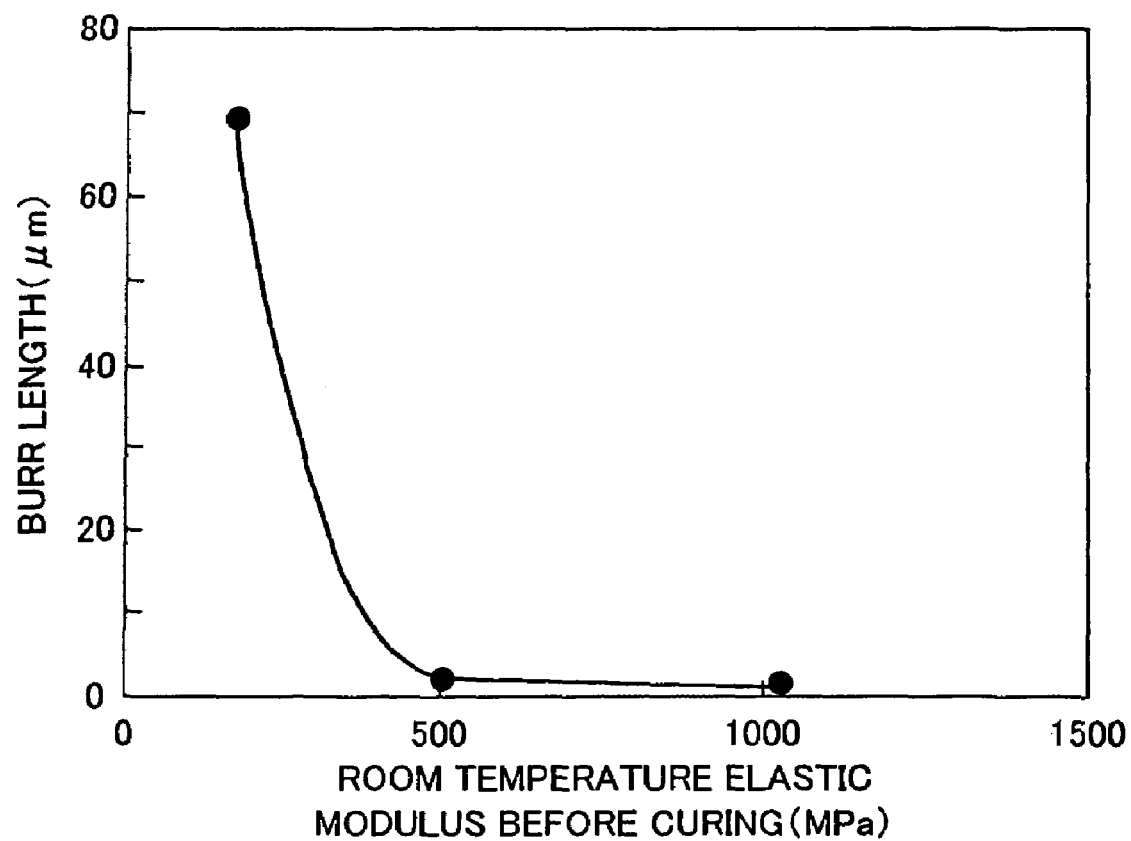
FIG. 5 is a graph showing an example of the correlation of room temperature elastic modulus of a pre-cured adhesive film used in the first embodiment of the present invention vs. burr length in a dicing process.

FIG. 5 shows an example of the correlation of room temperature elastic modulus (25° C.) of a 75 μm thick adhesive film 22 vs. the burr length at the time of dicing. As seen, when the room temperature elastic modulus (25° C.) of the adhesive film 22 is 500 MPa or more, the burr length becomes short, which can prevent easiness of picking up the semiconductor element 8 from lowering. Note that the room temperature elastic modulus of the adhesive film 22 is preferably 1200 MPa or less since too high a room temperature elastic modulus of the adhesive film 22 may possibly adversely affect the dicing process itself.

Figure 3D:
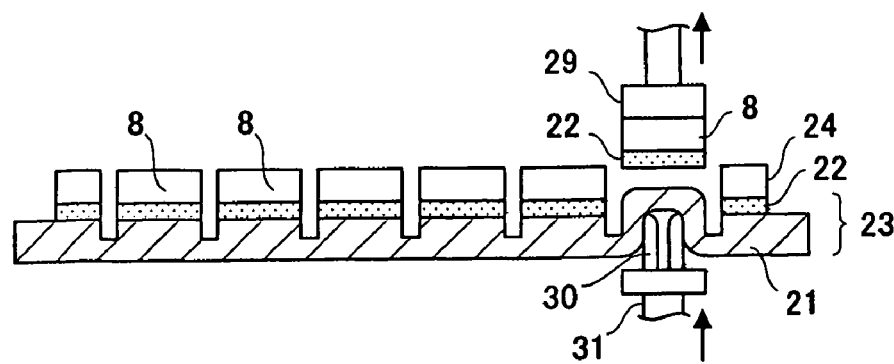

Next, as shown in FIG. 3D, the second semiconductor element 8 in a cut piece state is released from and picked up from the dicing film 21 by using a suction collet 29 and a release mechanism 31 having several push pins 30. Specifically, the second semiconductor element 8 suction-held by the suction collet 29 is pressed by the push pins 30 from its rear surface side while being moved up, so that the second semiconductor element 8 is released from the dicing film 21. Incidentally, the release mechanism 31 is not limited to a mechanism including the push pins 30 for pushing up, but a possible example thereof is a mechanism including, for example, a butterfly-shaped member that fans out, the member pushing up the rear surface of the dicing film 21 when being closed toward the center.

The dicing film 21 needs to have plasticity high enough to bend when being pushed up from under so that a release starting point is made at an end portion thereof in the pickup process of the semiconductor element 8. The dicing film 21, if too hard, is difficult to separate at the pickup time, resulting in an increased incidence of pickup failure. Therefore, the dicing film 21 used in this embodiment has a thickness of 140

μm or less and a room temperature elastic modulus (25° C.) of 120 MPa or less. Such a dicing film 21 can reduce the incidence of pickup failure since the release starting point is easily made therein. In view of increasing a pickup success rate of the semiconductor element 8, the dicing film 21 preferably has a thickness of 120 μm or less, and more preferably has a room temperature elastic modulus (25° C.) of 85 MPa or less.

As described above, the use of the dicing film 21 having a thickness of not less than 50 μm nor more than 140 μm and a room temperature elastic modulus (25° C.) of not less than 30 MPa nor more than 120 MPa can increase both the success rate of affixing the complex film and the success rate of picking up the semiconductor element 8 which contradict each other. Specifically, in a case where the adhesive film 22 with a thickness of 30 μm or more is affixed on the semiconductor wafer 24 together with the dicing film 21 beforehand, it is possible to improve manufacturing yields from the process of affixing the complex film 23 to the process of picking up the semiconductor element 8 (yields of the elements in the affixing process, the dicing process, and the pickup process).

Figure 6:
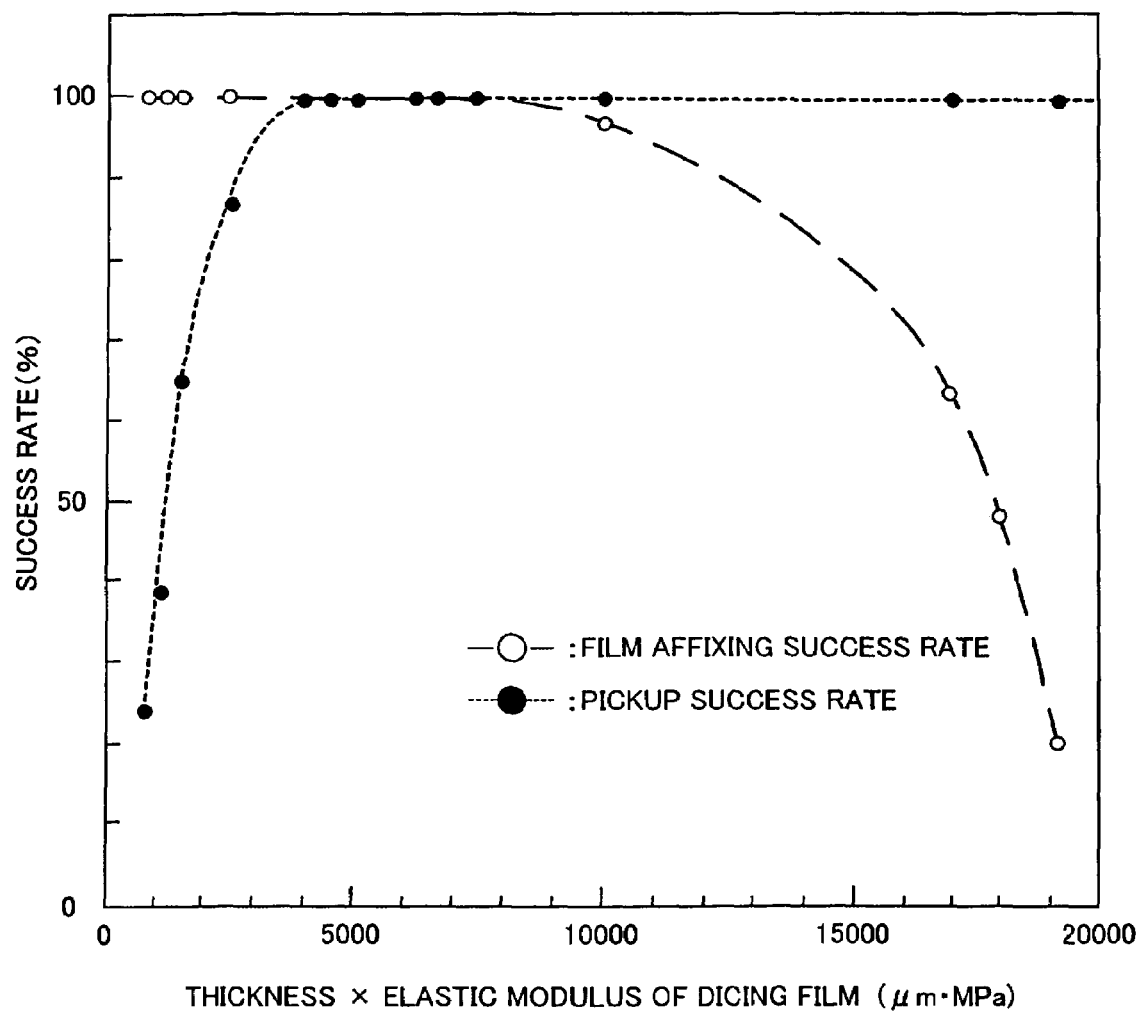
FIG. 6 is a graph showing an example of the correlation of a success rate of affixing the complex film and a success rate of picking up a semiconductor element vs. thickness and room temperature elastic modulus (thickness×room temperature elastic modulus) of a dicing film, in the first embodiment of the present invention.

Table 1 and FIG. 6 show an example of the success rate of affixing the complex film 23 and the success rate of picking up the semiconductor element 8, depending on the thickness and room temperature elastic modulus (thickness×room temperature elastic modulus (μm·MPa)) of the dicing film 21.

TABLE 1

| Sample No. | Thickness (μm) | Elastic Modulus (MPa) | Thickness × Elastic Modulus (μm × MPa) | Film Bonding Success Rate (%) | Pickup Success Rate (%) |
| --- | --- | --- | --- | --- | --- |
| 1 | 30 | 30 | 900 | 24 | 100 |
| 2 | 40 | 30 | 1200 | 38 | 100 |
| 3 | 50 | 30 | 1500 | 65 | 100 |
| 4 | 50 | 50 | 2500 | 87 | 100 |
| 5 | 70 | 57 | 3990 | 100 | 100 |
| 6 | 70 | 65 | 4550 | 100 | 100 |
| 7 | 110 | 45 | 4950 | 100 | 100 |
| 8 | 110 | 57 | 6270 | 100 | 100 |
| 9 | 70 | 94 | 6580 | 100 | 100 |
| 10 | 130 | 57 | 7410 | 100 | 100 |
| 11 | 100 | 102 | 10200 | 100 | 97 |
| 12 | 140 | 120 | 16800 | 100 | 64 |
| 13 | 150 | 120 | 18000 | 100 | 48 |
| 14 | 160 | 120 | 19200 | 100 | 20 |

Here, Si wafers with 8 inch diameter×60 μm thickness and adhesive films with 85 μm thickness were used. The dimension of Si chips was 10.71×7.08×0.06 mm. As is apparent from Table 1 and FIG. 6, when the dicing film 21 is not less than 50 μm nor more than 140 μ in thickness and not less than 30 MPa nor more than 120 MPa in room temperature elastic modulus, in particular, not less than 85 μm nor more than 120 μm in thickness and not less than 40 MPa nor more than 85 MPa in room temperature elastic modulus, the success rate of affixing the complex film 23 and the success rate of picking up the semiconductor element 8 can be both increased.

Next, the second semiconductor element 8 is bonded on the first semiconductor element 5, using, as the second adhesive layer 9, the adhesive film 22 affixed on the rear surface of the second semiconductor element 8. A bonding process of the second semiconductor element 8 is carried out in the following manner, for instance. Specifically, the circuit board 2 on which the first semiconductor element 5 is bonded is placed on the heating stage. Meanwhile, the second semiconductor element 8 having the adhesive layer 9 (adhesive film 22) formed on the rear surface thereof is held by the suction tool. The second semiconductor element 8 held by the suction tool is moved down after being aligned relative to the first semiconductor element 5, and the second adhesive layer 9 is pressed against the first semiconductor element 5. At this time, the second adhesive layer 9 is heated by using at least one of the heating stage and the suction tool.

The second adhesive layer 9 has a thickness large enough to take part of the first bonding wires 7 (end portions connected to the second semiconductor element 8) therein and has a function of keeping the first and second semiconductor element 5, 8 apart from each other based on its bonding-time viscosity (not less than 1 kPa·s and less than 100 kPa·s). Therefore, the second adhesive layer 9 can prevent the contact of the first bonding wires 7 and the second semiconductor element 8. In this state, the second adhesive layer 9 is further heated to be thermally cured, so that it is possible to stack, on the first semiconductor element 5, the second semiconductor element 8 which is equal to or larger than the first semiconductor element 5 in size, while preventing the occurrence of insulation failure and short circuit ascribable to the contact of the first bonding wires 7 and the second semiconductor element 8.

Thereafter, a wire bonding process is applied to the second semiconductor element 8 to electrically connect the electrode parts 4 of the circuit board 2 and the electrode pads 8*a* of the second semiconductor element 8 by the second bonding wires 10. At this time, the second semiconductor element 8, if being 80 μm or less in thickness, bends greatly due to a bonding load, and thus tends to suffer crack and breakage. A bending amount of the second semiconductor element 8 depends on an elastic modulus of the post-cured second adhesive layer 9 and tends to become large when the elastic modulus of the post-cured second adhesive layer 9 at the bonding temperature (for example 175° C.) is low.

Figure 7:
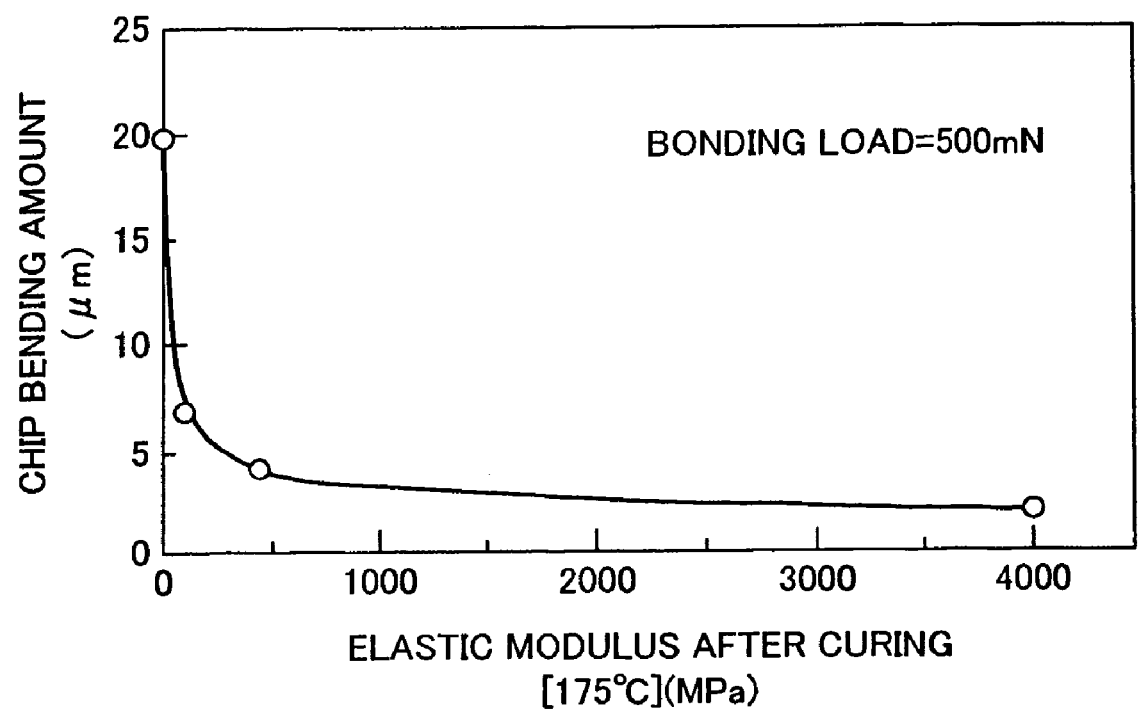
FIG. 7 is a graph showing an example of the correlation of elastic modulus of a post-cured adhesive layer (175° C.) vs. a bending amount of a semiconductor element at the bonding time.
Figure 8:
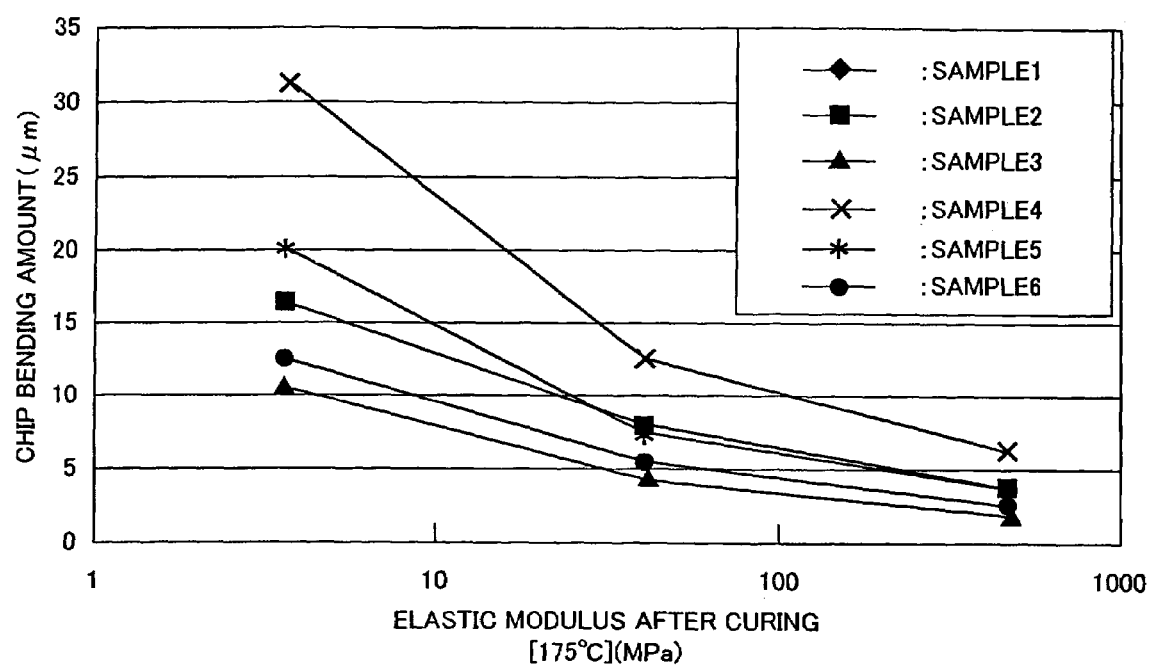
FIG. 8 is a graph showing the correlation of elastic modulus of a post-cured adhesive layer (175° C.) and a bending amount of a semiconductor element at the bonding time, depending on the thickness of a semiconductor element.

FIG. 7 shows the correlation of the elastic modulus (175° C.) of the post-cured second adhesive layer 9 vs. a bending amount of a Si chip in the bonding with a 500 mN load when the Si chip has a 70 μm thickness and the post-cured second adhesive layer 9 has an 85 μm thickness. FIG. 8 shows the correlation of the elastic modulus (175° C.) of the post-cured second adhesive layer 9 vs. a bending amount of the second semiconductor element 8 at the time of wire boning, depending on the thickness of the second semiconductor element 8 and the thickness of the second adhesive layer 9.

In FIG. 8, in a sample 1, the thickness of a semiconductor element (chip thickness) is 50 μm and the thickness of the post-cured second adhesive layer 9 (joining layer thickness) is 60 μm. In a sample 2, chip thickness is 70 μm and joining layer thickness is 60 μm. In a sample 3, chip thickness is 90 μm and joining layer thickness is 60 μm. In a sample 4, chip thickness is 50 μm and joining layer thickness is 85 μm. In a sample 5, chip thickness is 70 μm and joining layer thickness is 85 μm. In a sample 6, chip thickness is 90 μm and joining layer thickness is 85 μm.

As is apparent from FIG. 7 and FIG. 8, when an elastic modulus of the post-cured second adhesive layer 9 at 175° C. is 40 MPa or more, the bending amount of the second semiconductor element 8 in the wire bonding process can be made as small as 15 μm or less. Therefore, it is possible to prevent the second semiconductor element 8 from suffering crack and breakage ascribable to the bending.

According to the manufacturing method of this embodiment, it is possible to increase both the success rate of affixing the complex film 23 and the success rate of picking up the second semiconductor element 8. Moreover, it is possible to lower a failure incidence in the dicing process of the semiconductor wafer 24 based on the room temperature elastic modulus of the pre-cured adhesive film 22. This can improve manufacturing yields of the stack-type semiconductor device 1 in which part of the first bonding wires 7 are taken into the second adhesive layer 9. In other words, the stack-type semiconductor device 1 with improved reliability can be manufactured with high yields.

Figure 9:
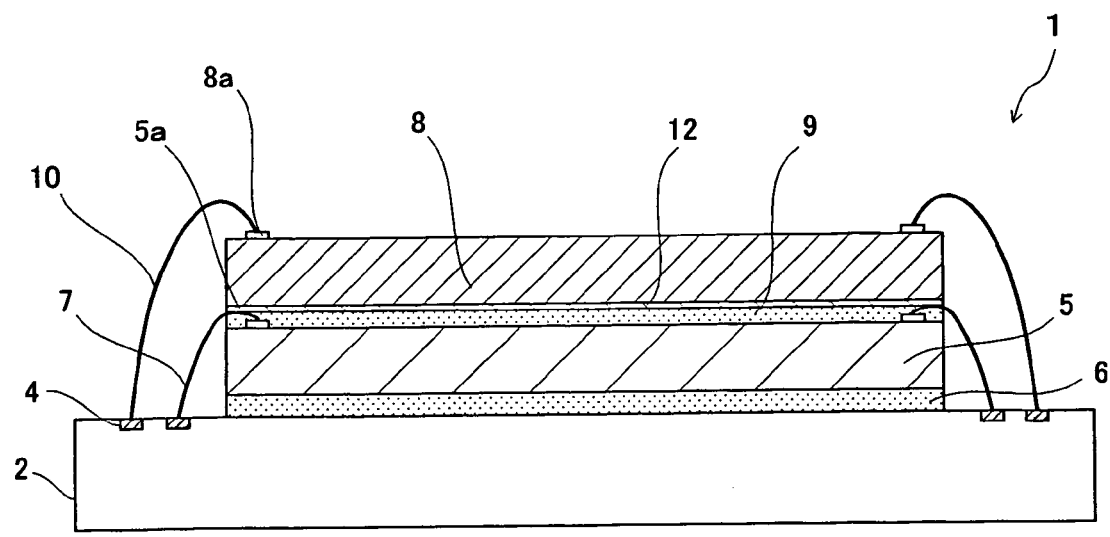
FIG. 9 is a cross-sectional view showing a modification example of the stack-type semiconductor device shown in FIG. 1.

In the stack-type semiconductor device 1 of the embodiment described above, the second adhesive layer 9 whose bonding-time viscosity is not less than 1 kPa·s and less than 100 kPa·s prevents the contact of the first bonding wires 7 and the second semiconductor element 8. In addition, an insulating layer 12 may be formed on a bottom surface of the second semiconductor element 8 as shown in, for example, FIG. 9. Providing the insulating layer 12 on the bottom surface of the second semiconductor element 8 makes it possible to more surely prevent the occurrence of insulation failure and short circuit ascribable to the contact of the first bonding wires 7 and the second semiconductor element 8.

An example used as the insulating layer 12 is an insulating resin layer whose bonding-time viscosity is 100 kPa·s or more. If the bonding-time viscosity of the insulating layer 12 is less than 100 kPa·s, the function of preventing the contact of the first bonding wires 7 and the second semiconductor element 8 cannot be obtained with good reproducibility. The bonding-time viscosity of the insulating layer 12 is preferably 130 kPa·s or more, more preferably 200 kPa·s or more. However, the insulating layer 12, if having too high viscosity, loses the function as a joining layer, and therefore, the bonding-time viscosity of the insulating layer 12 is preferably less than 1000 kPa·s. Further, the thickness of the insulating layer 12 is preferably within a range of not less than 5 μm nor more than 15 μm.

For forming the stack-type semiconductor device 1 in which the joining layer interposed between the first and second semiconductor elements 5, 8 has a two-layered structure of the insulating layer 12 and the adhesive layer 9, used is a complex film which is formed in the following manner. An insulating resin film (for example, a second resin film whose bonding-time viscosity is 100 kPa·s or more) capable of keeping a layered form at the bonding temperature is stacked on an adhesive film (for example, a first resin film whose bonding-time viscosity is not less than 1 kPa·s and less than 100 kPa·s) beforehand, and this two-layered film and a dicing film are stacked and integrated. Therefore, the manufacturing processes of the embodiment described above can be applied. Further, similarly to the above described embodiment, the effect of improving the manufacturing yields of the second semiconductor element 8 is obtainable, leading to the effect of improving manufacturing yields of the stack-type semiconductor device 1.

A concrete example of a constituent material of the insulating layer 12 is thermosetting resin such as polyimide resin, silicone resin, epoxy resin, or acrylic resin, and resin high in bonding-time viscosity than the second adhesive layer 9 is used. For forming the insulating layer 12, a two-layered film may be also formed in the following manner, for instance. An insulating resin composition same as an adhesive is used, and by varying the drying temperature and drying time of the insulating resin composition, a two-layered film formed of an adhesive film and an insulating resin film different in bonding-time viscosity is obtained.

In the case where the insulating layer 12 is provided on the rear surface of the semiconductor element 8, the first bonding wires 7 may be positively brought into contact with the insulating layer 12 so as to be deformed toward the circuit board 2 side. That is, the insulating layer 12 can be utilized not only as a layer for preventing short circuit and the like caused by the contact of the first bonding wires 7 and the second semiconductor element 8, but also as a layer for positively deforming the first bonding wires 7 toward the circuit board 2 side. Deforming the first boning wires 7 toward the circuit board 2 side by utilizing the insulating layer 12 makes it possible to realize further thinning of the stack-type semiconductor device 1.

Specifically, in the process of pressing the second adhesive layer 9 against the first semiconductor element 5, the first bonding wires 7 are at least partly brought into contact with the insulating layer 12 to be deformed toward the circuit board 2 side. This can make the wire height of all the first bonding wires 7 equal to or less than a standard value of the wire height. In other words, the height of all the first bonding wires 7 becomes equal to or less than the thickness of the second adhesive layer 9, which enables further thinning of the whole semiconductor device 1 based on the thickness of the second adhesive layer 9. No insulation failure, short circuit, or the like occurs since the first bonding wires 7 are kept insulated from the second semiconductor element 8 by the insulating layer 12. For these reasons, it is possible to realize the semiconductor device 1 with a stack-type multichip package structure achieving both further thinning and higher reliability.

Figure 10:
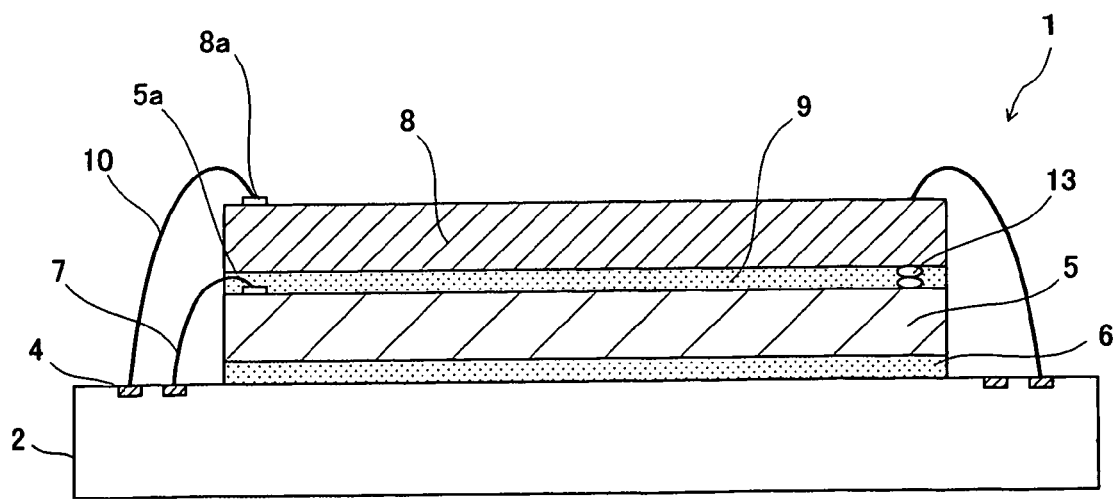
FIG. 10 is a cross-sectional view showing another modification example of the stack-type semiconductor device shown in FIG. 11.

In order to keep the first semiconductor element 5 and the second semiconductor element 8 apart from each other, stud bumps 13 made of a metal material, a resin material, or the like may be formed on the electrode pads of the first semiconductor element 5 not used for connection, namely, non-connection pads, for example as shown in FIG. 10. The stud bumps 13 effectively function for preventing insulation failure, short circuit, and the like ascribable to the contact of the first bonding wires 7 and the second semiconductor element 8. Further, filling the non-connection pads and fuse parts with the stud bumps 13 makes it possible to prevent the occurrence of bubbles caused by these portions. The stud bump 13 may be provided in one place, but is preferably provided in three places or more collinear on a line going through the gravity center of the first semiconductor element 5.

Figure 11A:
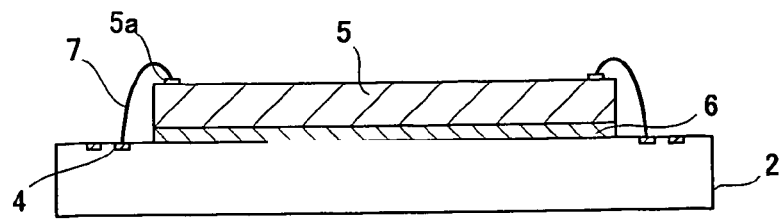
FIG. 11A, FIG. 11B, and FIG. 11C are cross-sectional views showing manufacturing processes of a stack-type semiconductor device according to a second embodiment of the present invention.
Figure 11B:
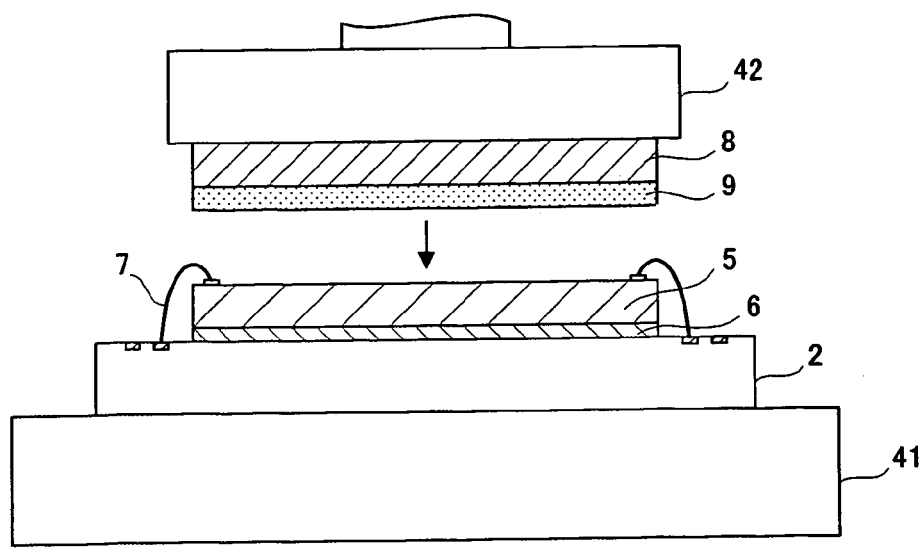
Figure 11C:
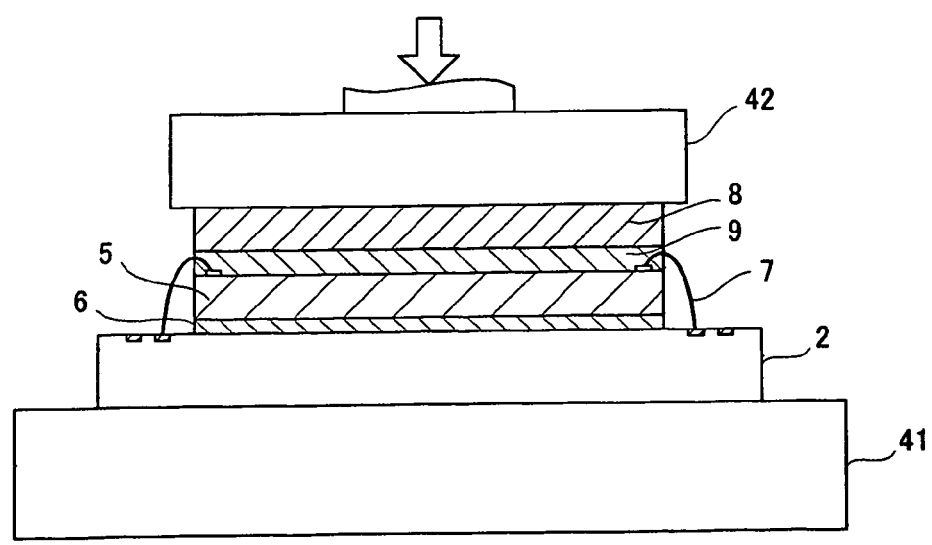

Next, manufacturing processes of a stack-type semiconductor device according to a second embodiment of the present invention will be described with reference to FIG. 11A to FIG. 11C and FIG. 12A to FIG. 12D. Here, based on the stack-type semiconductor device 1 shown in FIG. 1, the manufacturing processes according to the second embodiment will be described. FIG. 11A to FIG. 11C are cross-sectional views showing manufacturing processes of the stack-type semiconductor device 1. FIG. 12A to FIG. 12D are partly enlarged cross-sectional views of FIG. 11A to FIG. 1C, and are cross-sectional views of processes of bonding the first semiconductor element 5 and the second semiconductor element 8 seen from a side face direction of the elements (a direction in which cross sections of the bonding wires 7 are seen).

A concrete structure of the stack-type semiconductor device 1 is the same as that previously described. As the second adhesive layer 9, it is preferable to use an insulating resin layer whose thickness is 30 μm or more, as described above. More preferably, the second adhesive layer 9 has a thickness of not less than 60 μm nor more than 150 μm. The second adhesive layer 9 is preferably made of a thermosetting resin layer whose bonding-time viscosity is not less than 1 kPa·s and less than 100 kPa·s. The bonding-time viscosity of the second adhesive layer 9 is more preferably within a range from 1 kPa·s to 50 kPa·s, and still more preferably, within a range from 1 kPa·s to 20 kPa·s. The other structure is also the same as that described above.

First, as shown in FIG. 1A, the first semiconductor element 5 is bonded on the circuit board 2 by using the first adhesive layer 6. A lead frame or the like may be used instead of the circuit board 2. Subsequently, the wire bonding process is carried out to electrically connect the electrode parts 4 of the circuit board 2 and the electrode pads 5a of the first semiconductor element 5 by the first bonding wires 7. Next, the second semiconductor element 8 is bonded on the first semiconductor element 5 via the second adhesive layer 9.

In carrying out the process of bonding the second semiconductor element 8 on the first semiconductor element 5, the circuit board 2 on which the first semiconductor element 5 is bonded is placed on a stage (heating stage) 41 having a heating mechanism (not shown) as shown in FIG. 11B. The first semiconductor element 5 is heated directly by the heating stage 41. The temperature for heating the first semiconductor element 5 is appropriately set depending on, for example, softening temperature or melting temperature of the second adhesive layer 9.

Meanwhile, the second adhesive layer 9 is formed on the rear surface of the second semiconductor element 8. For forming the second adhesive layer 9, a semi-cured adhesive film is affixed on the rear surface of the second semiconductor element 8 or an adhesive resin composition is applied on the rear surface of the second semiconductor element 8. As shown in FIG. 11B, the second semiconductor element 8 having the second adhesive layer 9 thereon is positioned above the first semiconductor element 5 while being held by a suction tool 42 which is kept at room temperature. The suction tool 42 suction-holds the second semiconductor element 8 while kept at room temperature. Incidentally, the suction tool 42 may have a mechanism for auxiliarily heating the second semiconductor element 8.

A forming process of the second adhesive layer 9 can be carried out in the same manner as that of the first embodiment described above. Specifically, after the complex film formed of the integrated dicing film and adhesive film is affixed on the rear surface of the semiconductor wafer beforehand, the semiconductor wafer is divided into the element regions, whereby the second semiconductor elements 8 are made. Subsequently, the second semiconductor element 8 is held by the suction tool 42 to be picked up. In this manner, the second semiconductor element 8 having the second adhesive layer 9 is made. The second semiconductor element 8 held by the suction tool 42 is positioned above the first semiconductor element 5.

The second adhesive layer 9 in a cut piece state may be disposed on the first semiconductor element 5. Specifically, an adhesive film in a cut piece state is disposed as the second adhesive layer 9 on the first semiconductor element 5 placed on the heating stage 41. The adhesive film (9) in a cut piece state is held by a suction tool separately from the second semiconductor element 8 to be disposed on the first semiconductor element 5. In the case where a process of placing the second adhesive layer 9 is carried out separately from a process of placing the second semiconductor element 8, the same bonding process as in the case where the second adhesive layer 9 is formed on the rear surface of the second semiconductor element 8 is also applicable.

Figure 12A:
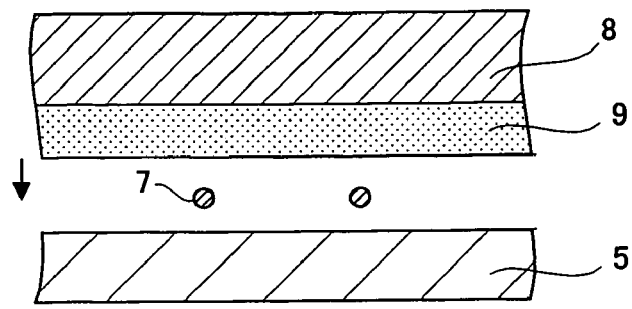
FIG. 12A, FIG. 12B, FIG. 12C, and FIG. 12D are enlarged cross-sectional views of the manufacturing processes of the stack-type semiconductor device shown in FIG. 11A, FIG. 11B, and FIG. 1C.
Figure 12B:
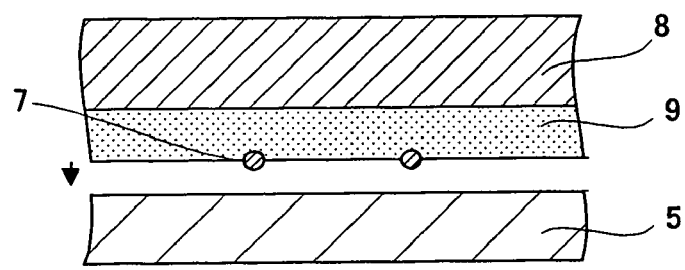

Next, as shown in FIG. 11B and FIG. 12A, the second semiconductor element 8 disposed above the first semiconductor element 5 is gradually moved down. At this time, even though the second semiconductor element 8 is not heated directly from the suction tool 42, the second adhesive layer 9 is heated by radiant heat from the first semiconductor element 5 to soften since the first semiconductor element 5 is heated to a predetermined bonding temperature. Note that the second semiconductor element 8 may be auxiliarily heated by the suction tool 42. When the second semiconductor element 8 further moves down, the second adhesive layer 9 first comes into contact with the first bonding wires 7 (FIG. 12B).

Figure 12C:
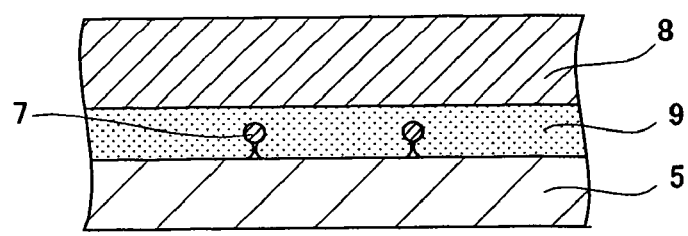

The second adhesive layer 9, when coming into contact with the first bonding wires 7, receives heat transfer from the first bonding wires 7, so that the vicinity of portions of the second adhesive layer 9 in contact with the first bonding wires 7 further softens. Therefore, when only the heating stage 41 is a heating source, the second adhesive layer 9 does not cause the deformation or connection failure of the first bonding wires 7 when the second semiconductor element 8 is moved down. Moreover, the layered form of the second adhesive layer 9 can be kept in good condition. When the second semiconductor element 8 further moves down, the second adhesive layer 9 comes into contact with the first semiconductor element 5 as shown in FIG. 12C, so that the whole second adhesive layer 9 is softened or melted by the heat from the first semiconductor element 5.

While the second semiconductor element 8 is moving down, the first bonding wires 7 heat portions thereof in contact with the second adhesive layer 9 by the own temperature, so that they are taken into the second adhesive layer 9. At the descending stage of the second semiconductor element 8, a slight gap occurs under the first bonding wires 7, but when the second adhesive layer 9 comes into contact with the first semiconductor element 5 to be heated, the softened or melted adhesive resin (thermosetting resin forming the second adhesive layer 9) enters the gap under the first bonding wires 7. This can prevent the portion under the wires from being left unfilled with the resin.

In softening the second adhesive layer 9 by the radiant heat from the first semiconductor element 5 and by the heat transfer from the first bonding wires 7, it is important to adjust the descending speed of the second semiconductor element 8. Too high a descending speed of the second semiconductor element 8 may possibly result in insufficient softening of the second adhesive layer 9 by the radiant heat from the first semiconductor element 5 and so on. Therefore, the descending speed of the second semiconductor element 8 is preferably within a range of not less than 0.1 mm/s nor more than 20 mm/s. The descending speed of the second semiconductor element 8 exceeding 20 mm/s results in insufficient heating of the second adhesive layer 9 by the radiant heat from the first semiconductor element 5 and so on. On the other hand, lowering the descending speed of the second semiconductor element 8 to less than 0.1 mm/s not only brings about no higher effect but also leads to lower manufacturing efficiency of the stack-type semiconductor device 1.

Moreover, if the descending start position of the second semiconductor element 8 is too close to the first semiconductor element 5, the second adhesive layer 9 cannot be sufficiently heated by the radiant heat from the first semiconductor element 5 and so on even with the adoption of the aforesaid descending speed of the second semiconductor element 8. Therefore, the descending start position of the second semiconductor element 8 is preferably set at least 0.5 mm apart upward from the first semiconductor element 5. Thus, the second semiconductor element 8 is preferably moved down from the position at least 0.5 mm apart upward from the first semiconductor element 5 at a speed within a range of not less than 0.1 mm/s nor more than 20 mm/s. The descending speed of the second semiconductor element 8 is more preferably within a range of 1 mm/s to 5 mm/s.

Figure 13:
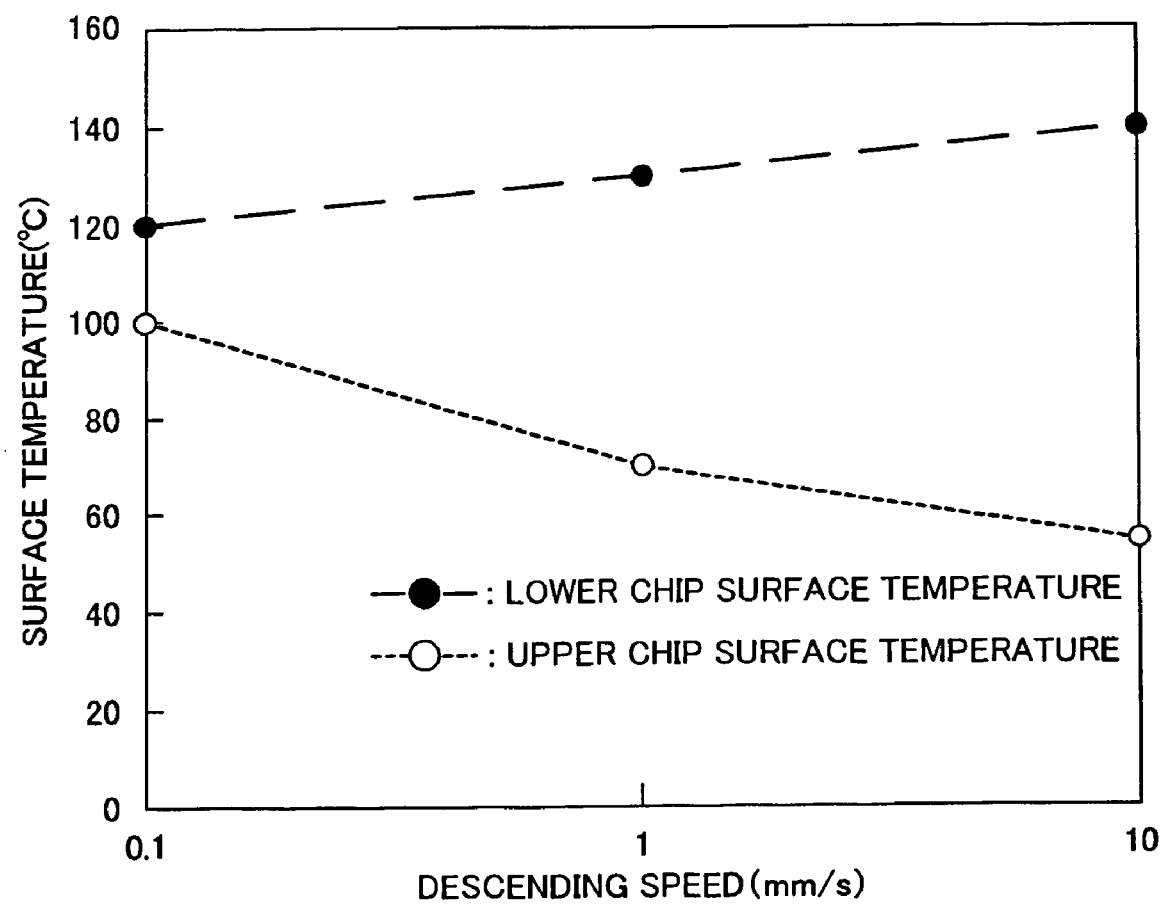
FIG. 13 is a graph showing an example of the correlation of descending speed of a second semiconductor element vs. surface temperatures of a first semiconductor element and the second semiconductor element, in the second embodiment of the present invention.
Figure 14:
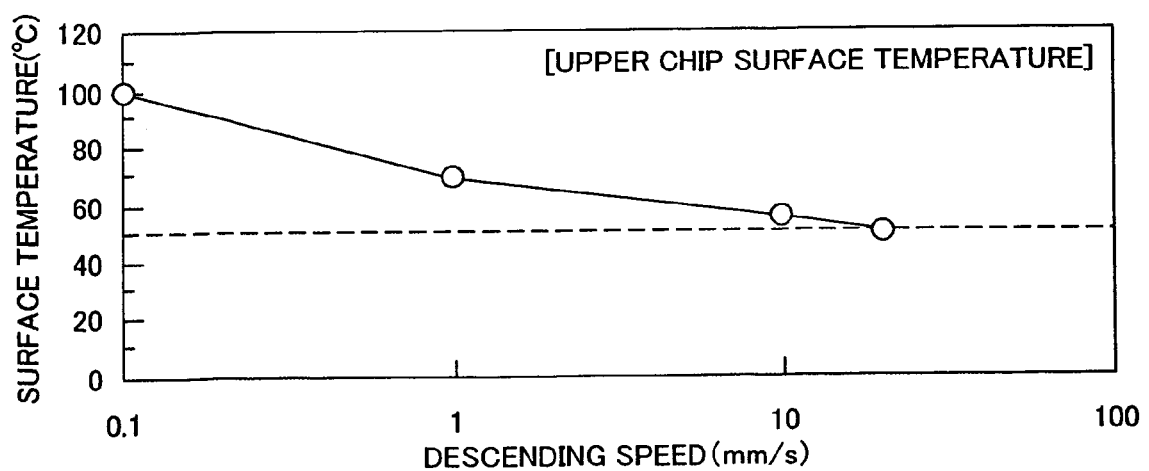
FIG. 14 is a graph showing an example of the correlation of descending speed of the second semiconductor element vs. surface temperature thereof in the second embodiment of the present invention.

FIG. 13 and FIG. 14 show an example of the correlation of the descending speed of the second semiconductor element 8 vs. surface temperatures. Here, the surface temperatures of the first and second semiconductor elements 5, 8 were measured when the second semiconductor element (Si chip) 8 was moved down from a position (descending start position) 0.96 mm apart upward from the first semiconductor element (Si chip) 5 to a position (descending stop position) 0.46 mm apart upward therefrom at varied speed. Only the heating stage 41 was used for heating and its heating temperature was adjusted so that the temperature of the first semiconductor element 5 becomes 140° C.

As is apparent from FIG. 13 and FIG. 14, the temperature of the second semiconductor element 8 varies depending on its descending speed. The second adhesive layer 9, even if heated only by the radiant heat from the first semiconductor element 5, can be sufficiently heated if the descending speed of the second semiconductor element 8 is adjusted. When the descending speed of the second semiconductor element 8 is set to 20 mm/s or lower, the temperature of the second semiconductor element 8 can be kept at 50° C. or higher. The second adhesive layer 9 is generally affixed on the second semiconductor element 8 at a temperature of 50° C. or lower, and therefore, keeping the temperature of the second semiconductor element 8 at 50° C. or higher makes it possible to soften the second adhesive layer 9.

Figure 12D:
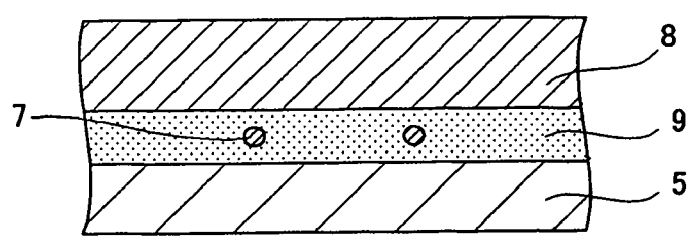

Subsequently, as shown in FIG. 12D, a moderate pressure is applied to the second semiconductor element 8 while the first semiconductor element 5 and the second adhesive layer 9 are kept heated by the heating stage 41. The pressure application to the second semiconductor element 8 increases flowability of the second adhesive layer 9, so that the gap under the first bonding wires 7 can be surely filled with the adhesive resin in good condition. Therefore, no portion in the gap under the wires is left unfilled with the resin. The second adhesive layer 9 has a thickness large enough to take part of the first boning wires 7 therein and keeps the elements apart from each other based on its bonding-time viscosity and heated state, and thus is capable of preventing the contact of the first bonding wires 7 and the second semiconductor element 8.

The second adhesive layer 9 in this state is further heated to be thermally cured, so that the second semiconductor element 8 whose dimension is equal to or larger than the first semiconductor element 5 can be stacked on the first semiconductor element 5 in good condition (FIG. 11C). That is, the prevention of the deformation and connection failure of the first bonding wires 7 and of occurrence of the resin unfilled portions under the wires and the prevention of the insulation failure and short circuit caused by the contact of the first bonding wires 7 and the second semiconductor element 8 can be both achieved. Consequently, it is possible to greatly reduce deterioration in manufacturing yields and reliability of the stack-type semiconductor device 1 ascribable to the process of bonding the first semiconductor element 5 and the second semiconductor element 8.

Thereafter, the second semiconductor element 8 bonded on the first semiconductor element 5 is subjected to the wire bonding process, so that the electrode parts 4 of the circuit board 2 and the electrode pads 8*a* of the second semiconductor element 8 are electrically connected by the second bonding wires 10. Further, when necessary, the first and second semiconductor elements 5, 8 are sealed by the sealing resin 11, so that the stack-type semiconductor device 1 shown in FIG. 1 is obtained. For stacking three semiconductor elements or more, the same processes as the above-described bonding processes of the second semiconductor element 8 are repeated.

In the manufacturing method of the second embodiment, it is possible to take the first bonding wires 7 in good condition into the second adhesive layer 9 whose layered form is maintained, while preventing the deformation and connection failure of the first bonding wires 7 and the occurrence of the resin unfilled portion under the wires. This can more surely prevent the occurrence of insulation failure and short circuit caused by the contact of the first bonding wires 7 and the second semiconductor element 8. That is, the stack-type semiconductor device 1 with improved reliability can be manufactured with high yields. Further, adopting the heating only by the heating stage 41 can prevent the deformation or the like of the second semiconductor element 8.

In the stack-type semiconductor device 1 according to the second embodiment, the second adhesive layer 9 whose bonding-time viscosity is not less than 1 kPa·s and less than 100 kPa·s prevents the contact of the first bonding wires 7 and the second semiconductor element 8. In addition, the insulating layer 12 may be formed on the bottom surface of the second semiconductor element 8 as shown in, for example, FIG. 9. Providing the insulating layer 12 on the bottom surface of the second semiconductor element 8 makes it possible to more surely prevent the occurrence of insulation failure and short circuit ascribable to the contact of the first bonding wires 7 and the second semiconductor element 8. A concrete structure of the insulating layer 12 is the same as that previously described, and an insulating resin layer whose bonding-time viscosity is 100 kPa·s or more is used. The thickness of the insulating layer 12 is preferably not less than 5 μm nor more than 15 μm.

In the case where the insulating layer 12 is provided on the bottom surface of the semiconductor element 8, the first bonding wires 7 may be positively brought into contact with the insulating layer 12 so as to deform toward the circuit board 2 side. This makes it possible to realize the semiconductor device 1 with the stack-type multichip package structure that achieves both further thinning and higher reliability. In order to keep the first semiconductor element 5 and the second semiconductor element 8 apart from each other, the stud bumps 13 made of a metal material, a resin material, or the like may be formed on the electrode pads of the first semiconductor element 5 not used for connection, namely, non-connection pads, for example as shown in FIG. 10.

Figure 15:
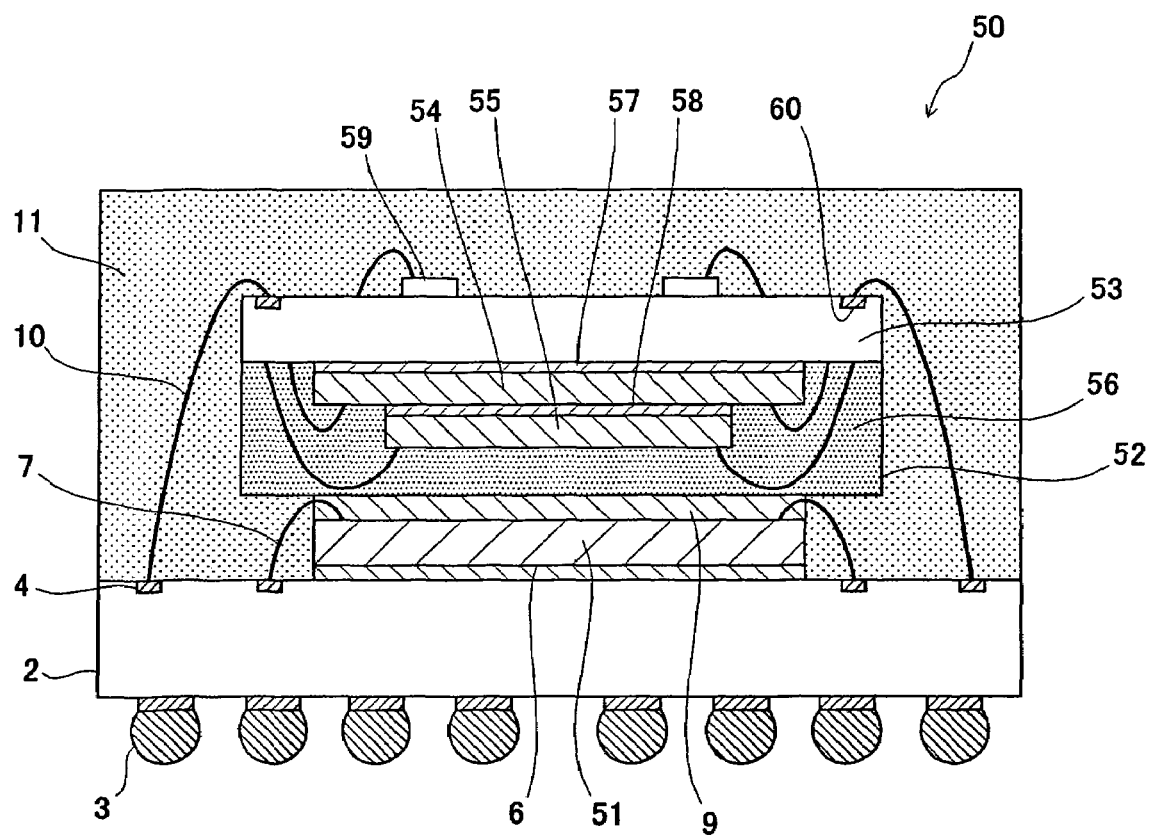
FIG. 15 is a cross-sectional view showing a structure of a stack-type electronic component that is manufactured by applying a manufacturing method according to a third embodiment of the present invention.

Next, a third embodiment of the present invention will be described with reference to FIG. 15. FIG. 15 is a cross-sectional view showing a structure of a stack-type semiconductor device (stack-type electronic component) formed by applying a manufacturing method according to the third embodiment of the present invention. The same reference numerals and symbols are used to designate the same parts as those of the second embodiment described above, and description thereof will be partly omitted. A stack-type semiconductor device 50 shown in FIG. 15 is formed of a semiconductor element 51 as a first electronic component and a package component 52 as a second electronic component which are stacked on each other and which constitute a stack-type package structure.

Thus, an electronic component included in the stack-type electronic component is not limited to a single semiconductor element (bare chip), but may be a component in which semiconductor elements are packaged beforehand. Further, the electronic component is not limited to a semiconductor component such as the semiconductor element 51 and the package component 52, but may be an electronic component such as a typical circuit component. Examples of the electronic component used in manufacturing the stack-type electronic component are a semiconductor component such as the semiconductor element 51 and the package component 52, and further, typical circuit components.

In the stack-type semiconductor device 50 shown in FIG. 15, as in the above-described embodiments, the semiconductor element 51 as the first electronic component is bonded on a circuit board 2 via a first adhesive layer 6. Electrode pads of the semiconductor element 51 are electrically connected to electrode parts 4 of the circuit board 2 via first bonding wires 7. The package component 52 as the second electronic component is bonded on the semiconductor element 51 via a second adhesive layer 9. A bonding process of the package component 52 is carried out while it is heated only from a stage on which the semiconductor element 51 is placed, as in the second embodiment. The structure of the second adhesive layer 9 and details of the bonding process are the same as those of the second embodiment.

The package component 52 has a structure in which a first semiconductor element 54 and a second semiconductor element 55 are stacked in sequence on a circuit board 53, and it is packaged by sealing resin 56 beforehand. The first semiconductor element 54 is bonded on the circuit board 53 via an adhesive layer 57. Similarly, the second semiconductor element 55 is bonded on the first semiconductor element 54 via an adhesive layer 58. Note that the reference numeral 59 denotes a passive component. The package component 52 thus structured is stacked on the semiconductor element 51 with the circuit board 53 arranged on the top. Further, electrode pads 60 provided on a rear surface side of the circuit board 53 are electrically connected to the electrode parts 4 of the circuit board 2 via second bonding wires 10.

It should be noted that the stacked structure of the semiconductor element 51 and the package component 52 is not limited to the structure shown in FIG. 15, but various stacked structures are applicable. An example of an adoptable structure is to dispose two semiconductor elements or more on a circuit board and stack a package component on the plural semiconductor elements. Such a stacked structure is effective when the semiconductor elements are greatly different in size from the package component. The circuit board may be arranged on the bottom side when the package component is stacked. In this case, the second bonding wires are connected to electrode pads provided on an upper surface side of the circuit board.

Then, the semiconductor element 51 and the package component 52 provided in the stacked manner on the circuit board 2 are sealed by sealing resin 11 such as, for example, epoxy resin, so that the stack-type semiconductor device 50 having the stack-type package structure is formed. In the stack-type semiconductor device 50 structured above, a failure incidence ascribable to the bonding process can be also reduced by applying the bonding process in which a heating source is only a stage on which the semiconductor element 51 is placed. That is, the stack-type semiconductor device 50 superior in reliability and soon can be manufactured with high yields. This also applies to a package in which a semiconductor component and other electronic component are stacked or a package in which electronic components other than a semiconductor component are stacked.

It should be noted that the manufacturing method of the present invention is not limited to either of the above-described embodiments, and is applicable to various kinds of stack-type semiconductor devices in which a plurality of semiconductor elements are stacked and packaged, and further to various kinds of stack-type electronic components in which a plurality of electronic components are stacked and packaged. It is understood that methods of manufacturing such stack-type semiconductor devices and stack-type electronic components are included in the present invention. Expansion and modification may be made in the embodiments of the present invention within the technical idea of the present invention, and the expanded and modified embodiments are also included in the technical scope of the present invention.

What is claimed is:

1. A method of manufacturing a stack-type semiconductor device, comprising:

bonding a first semiconductor element on a substrate;

affixing an integrated film formed of a dicing film and an adhesive film that are integrated, on a rear surface of a semiconductor wafer having a plurality of element regions which are to be second semiconductor elements, the dicing film having a thickness within a range of not less than 50 μm nor more than 140 μm and a room temperature elastic modulus within a range of not less than 30 MPa nor more than 120 MPa, and the adhesive film having a thickness of 30 μm or more and a room temperature elastic modulus before curing within a range of not less than 500 MPa nor more than 1200 MPa;

forming the second semiconductor elements by dividing the semiconductor wafer on which the integrated film is affixed, together with the adhesive film, into the element regions;

picking up the second semiconductor element from the dicing film; and bonding the picked-up second semiconductor element on the first semiconductor element by using, as an adhesive layer, the adhesive film affixed on the rear surface of the second semiconductor element.

2. The method of manufacturing the stack-type semiconductor device as set forth in claim 1, further comprising:

connecting an electrode part of the substrate and an electrode pad of the first semiconductor element via a bonding wire.

3. The method of manufacturing the stack-type semiconductor device as set forth in claim 1, wherein the adhesive film has an insulating resin layer whose viscosity at a bonding time is within a range of not less than 1 kPa·s and less than 100 kPa·s.

4. The method of manufacturing the stack-type semiconductor device as set forth in claim 1, wherein the adhesive film has:

a first insulating resin layer which is disposed on the first semiconductor element side and whose viscosity at a bonding time is within a range of not less than 1 kPa·s and less than 100 kPa·s; and a second insulating resin layer which is disposed on the second semiconductor element side and whose viscosity at the bonding time is 100 kPa·s more.

5. The method of manufacturing the stack-type semiconductor device as set forth in claim 1, wherein the adhesive film has a thickness within a range of not less than 60 μm nor more than 150 μm.

6. The method of manufacturing the stack-type semiconductor device as set forth in claim 2, wherein part of the bonding wire connected to the first semiconductor element is taken into the adhesive layer.

* * * * *